June 4, 1968 R. G. DONALD 3,387,193

DIFFUSED RESISTOR FOR AN INTEGRATED CIRCUIT

Filed March 24, 1966 2 Sheets-Sheet 1

INVENTOR
RAYMOND G. DONALD
BY [signature]
ATTORNEY

June 4, 1968 R. G. DONALD 3,387,193

DIFFUSED RESISTOR FOR AN INTEGRATED CIRCUIT

Filed March 24, 1966 2 Sheets-Sheet 2

INVENTOR
RAYMOND G. DONALD
BY
ATTORNEY 3,387,193
DIFFUSED RESISTOR FOR AN INTEGRATED CIRCUIT

Raymond G. Donald, Burlington, Mass., assignor to P. R. Mallory & Co., Inc., Indianapolis, Ind., a corporation of Delaware Filed Mar. 24, 1966, Ser. No. 537,033
4 Claims. (Cl. 317—235)

ABSTRACT OF THE DISCLOSURE

A multi-component integrated circuit means wherein resistive paths are in the substrate underlying an epitaxial layer containing the transistors of the integrated circuit.

The present invention relates to diffused resistors and more particularly to the means and methods for providing diffused resistors in integrated circuits.

In the art of molecular electronics, the functions of a plurality of conventional circuit components such as transistors, diodes, capacitors, and resistors are provided within a unitary body of semiconductive material with conductive interconnections selectively made between certain regions to provide the functions of a circuit which inherently has a high degree of reliability and other advantages over conventionally interconnected circuits. Such unitary structures are known as integrated circuits or functional electronic blocks.

At the present time, resistors are formed in integrated circuits by utilizing the base diffusion of the transistor structure to form the resistor path as is shown in FIGURE 1. This process has the advantage of not requiring an additional diffusion for the resistors, but has the following disadvantages.

First, the sheet resistivity of the base diffusion when optimized for the transistor design is lower than would be desirable to minimize the area occupied by the resistors.

Second, the sheet resistivity and, consequently, the resistor values are altered by the subsequent oxidations and diffusions necessary for the transistor fabrication. Hence, the spread of resistance values increases as processing proceeds.

Third, there is no freedom to design the resistors except for the surface geometry without altering the properties of the transistors and other devices in the circuit.

Fourth, tailoring of the resistor values in process is not generally possible.

Accordingly, there is presented in this specification a novel resistor and a novel method for forming said resistor in the substrate (or semiconductive wafer) underlying the epitaxial layer which contains the transistors of the integrated circuit. Hence, the total amount of resistance in the integrated circuit can be increased without increasing the area of the substrate or without interfering with the characteristics of the transistors formed in the epitaxial layer. One advantage of the present invention is that the resistor paths are formed by a separate and independently controlled diffusion so that the choice of impurity and sheet resistivity is unaffected by the transistor requirements. A very important advantage is that since the diffused region (resistor path) is totally imbedded in the substrate, there can be no loss of impurity during subsequent processing. Hence, resistor values can be determined prior to the fabrication of the transistors. Another advantage is that since the resistors are imbedded in the substrate, isolation islands are only required where the resistor path reaches the surface. Hence, a reduction of area occupied and parasitic capacitance is achieved. The reduction of parasitic capacitance between components of an integrated circuit is a problem that has faced integrated circuit manufacturers for some time. Other advantages of the present invention will become apparent as this specification proceeds.

It is an object of the present invention, therefore, to provide a novel method for forming resistors in an integrated circuit, said resistors being formed in the semiconductive wafer underlying the epitaxial layer containing the transistors. It is also an object of the present invention to provide a resistor structure fabricated by the methods disclosed in this specification.

It is another object of the present invention to provide a method for forming resistors in an integrated circuit, said method being independent of the process for forming the transistors.

It is a further object of the present invention to provide a method for forming resistors in an integrated circuit which will be changed less by subsequent process steps.

It is still another object of the present invention to provide a method for forming resistors in an integrated circuit which will only require isolation islands where the resistor path reaches the surface of the wafer.

It is another object of the present invention to provide a resistor for an integrated circuit which is of one type of conductivity and which is totally imbedded in a material of an opposite type of conductivity.

It is still a further object of the present invention to provide a resistor for an integrated circuit which requires isolation islands only where said resistor reaches the surface of the integrated circuit wafer, thereby reducing the amount of area required for said resistor and the parasitic capacitance characteristics of said resistor.

The present invention, in another of its aspects, relates to novel features of the instrumentalities described herein for teaching the principal object of the invention and to the novel principles employed in the instrumentalities whether or not these features and principles may be used in the said object and/or in the said field.

Other objects of the invention and the nature thereof will become apparent from the following description considered in conjunction with the accompanying drawings and wherein like reference numbers describe elements of similar function therein and wherein the scope of the invention is determined rather from the dependent claims.

For illustrative purposes, the invention will be described in conjunction with the accompanying drawings in which.

Generally, speaking, the present invention is a semiconductive device comprising: a region of a first conductivity type imbedded in a semiconductive wafer of a second conductivity type; a first layer of semiconductive material of said second conductivity type grown epitaxially over said wafer so as to cover said region; a second layer of semiconductive material of said first conductivity type grown epitaxially over said first layer so as to cover said region; a conductive path extending up from each end of said region through said first and second layers, said conductive paths being of said first conductivity type; and an isolation region surrounding each of said conductive paths in said second layer, said isolation regions being of said second conductivity type.

Also, the present invention is a method for fabricating a resistor in an integrated circuit comprising the steps of:

(a) Diffusing a resistor path of a first conductivity type into a semiconductive wafer of a second conductivity type, said second conductivity type being opposite that of said first conductivity type;

(b) Epitaxially depositing a semiconductive layer of said second conductivity type over said semiconductive wafer, thereby covering said resistive path; and (c) Diffusing contact regions of said first conductivity type through said epitaxially deposited semiconductive layer, thereby contacting the ends of said resistor path.

Figure 1:
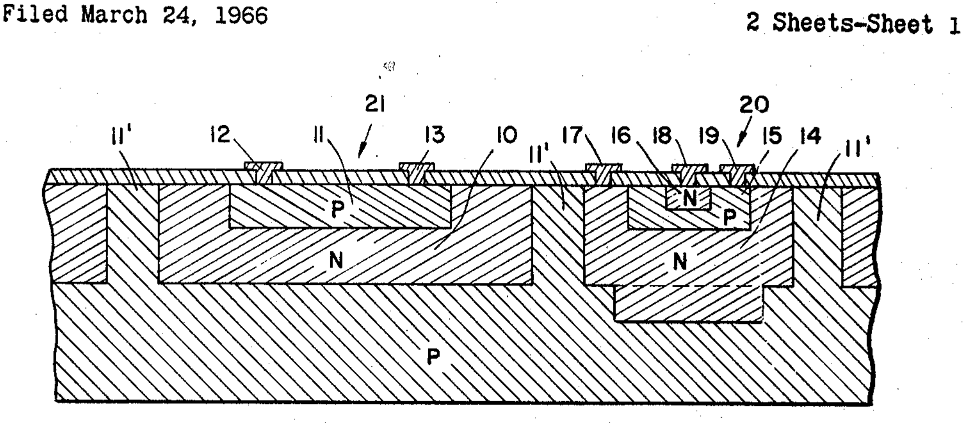
FIGURE 1 is a sectional view of an integrated circuit wafer illustrating how resistors are presently formed within the wafer.

Referring now to the drawing, and particularly to the sectional view of FIGURE 1, the present method of making resistors can be visualized in conjunction with the following description.

An n-type epitaxial layer is grown over the p-type wafer. In FIGURE 1, the n-type regions 10 and 14 are composed of this layer. P-type regions 11' are then diffused through the n-type layer to join with the underlying p-type region. The p-type regions 11' surround n-type regions such as 10 and 14 in the n-type epitaxial layer, which are thus electrically isolated from one another and in which resistors or transistors or other devices can be formed by subsequent diffusions. The n-type region 14 is the collector of the NPN transistor 20. The n-type region 10 is the isolated n-type region for the resistor 21. A p-type region is then diffused into the n-type epitaxial layer. This p-type region serves as the base 15 for the transistor 20 and the resistor path 11 for the resistor 21. An n-type region 16 is then diffused into the p-type region 15 to form the emitter for the transistor 20. The metallized pads 12 and 13 make contact to the resistor path 11. The metallized pads 17, 18 and 19 make contact, respectively, to the collector, emitter, and base of the transistor 20.

Figure 2:
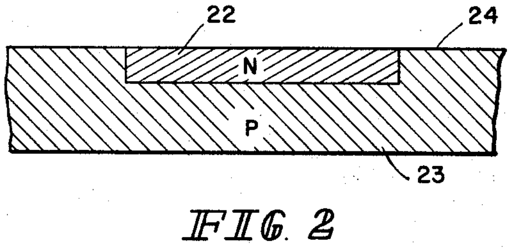
FIGURE 2 is a sectional view of a p-type semiconductive wafer with an n-type region diffused therein.

Referring now to FIGURE 2, the resistor structure and method of the present invention can be visualized in conjunction with the following description.

FIGURE 2 shows an n-type region 22 diffused into a p-type semiconductive wafer 23. The wafer 23, which is the starting material for the method of the present invention, is an essentially monocrystalline body of semiconductive material formed by any of the known crystal growing techniques. The wafer 23 has a major surface 24 which is planar and has sufficient area for the subsequent fabrication of function performing regions thereon. The thickness of the wafer 23 is at least sufficient to provide the desired degree of mechanical stability in the structure.

Silicon or another semiconductive material may be employed for the starting material, i.e., the wafer 23. In the following discussion, which is illustrative of the practice of this invention, it will be assumed that the starting material is of silicon since it is readily available and the individual process techniques such as epitaxial growth, oxide masking, and impurity diffusion are better known for silicon than for other semiconductive materials. Also, merely by way of illustration, the wafer 23 is designated as a high resistivity p-type silicon.

The n-type region 22 is diffused into the wafer 23 by use of the well known oxide-masking process to form the resistor path.

Figure 3:
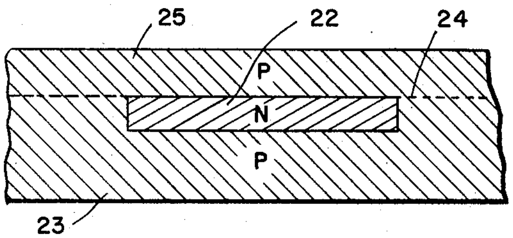
FIGURE 3 is a sectional view of the semiconductive wafer shown in FIGURE 2 with a p-type epitaxial layer grown over the n-type region.

Referring now to FIGURE 3, it can be seen that a p-type epitaxial layer 25 is grown over the wafer 23 major surface 24 so as to cover the n-type region 22. The p-type epitaxial layer 25 is monocrystalline extension of the wafer 23 and may, in general, be formed by the thermal decomposition of a compound of the semiconductive material. As stated previously, the epitaxial processes for silicon are well known. Also, the techniques for degreasing and chemically etching the major surface 24 in order to remove oxides prior to the epitaxial deposition are well known.

The purpose of the p-type epitaxial layer 25 is to imbed the resistor path 22 in p-type silicon.

Figure 4:
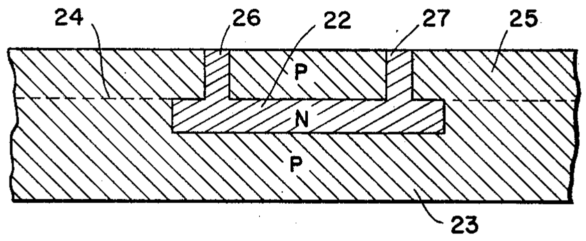
FIGURE 4 is a view showing contacts diffused through the p-type epitaxial layer to the n-type region.

Referring now to FIGURE 4, it can be seen that n-type regions 26 and 27 are diffused through the p-type epitaxial layer 25 so as to make contact with the resistor path 22. Hence, a complete resistor has been formed for an integrated circuit. The balance of the description will concern the making of the transistors of an integrated circuit over the p-type silicon containing the resistor path 22.

Figure 5:
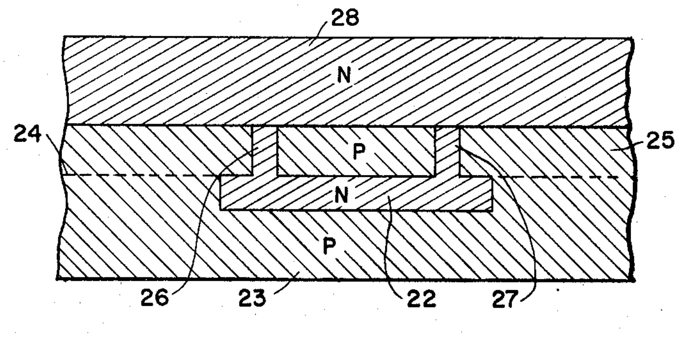
FIGURE 5 is a sectional view of the semiconductive wafer shown in FIGURE 4 with an n-type epitaxial layer grown over the p-type epitaxial layer.

Referring now to FIGURE 5 it can be seen that an n-type epitaxial layer 28 is grown over the p-type epitaxial layer 25. In this layer 28, the emitter, base, and collector of the transistors will be formed.

Figure 6:
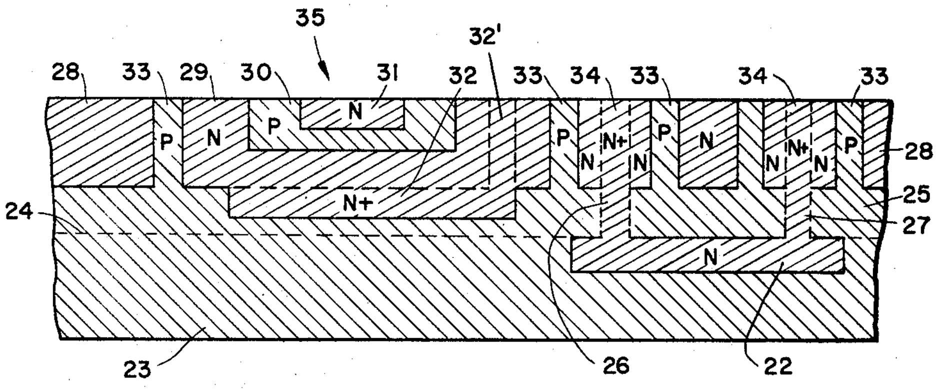
FIGURE 6 is a sectional view of a semiconductive wafer showing a completed integrated circuit having resistors formed by the method of the present invention.

Referring now to FIGURE 6, a completed integrated circuit having resistors fabricated by the method of the present invention can be discussed. The n-type region 29 is the collector for the transistor 35. The p-type region 30 is the base for the transistor 35 and the n-type region 31 is the emitter for the transistor 35. There is an N+ plug 32 formed under the collector of the transistor 35 by a diffusion prior to the growth of the n-type epitaxial layer. N+ regions 32' are formed by diffusion into the n-type epitaxial layer 28 to provide low resistance conductive paths from the surface of the n-type epitaxial layer to N+ region 32. The N+ regions 34 are diffused into the n-type layer 28 to form low resistance conductive paths from the surface of the n-type epitaxial layer 28 to n-type regions 26 and 27. The P-regions 33 are diffused into epitaxial layer 28 to form areas which isolate the conductive paths. The N+ regions 34 can be diffused at the same time as the N+ regions 32' are diffused. Metallized contacts similar to those shown in FIGURE 1 are formed on the conductive paths.

The process steps for making the NPN transistor 35 in the n-type epitaxial layer 28 are well known and need not be discussed in this specification. Obviously, other transistor configurations can be formed in an integrated circuit containing resistors fabricated by the method of the present invention.

Although the illustrative embodiment uses a p-type wafer, the method of the present invention can be used to form p-type resistor paths in an n-type wafer.

Referring now to FIGURE 5, the method of the present invention can be discussed in detail. The n-type region 22 is diffused into the high resistivity p-type silicon wafer 23 having a smooth and flat major surface 24. The p-type epitaxial layer 25 is then deposited over the wafer so as to completely imbed the n-type region 22 in p-type silicon. The n-type regions 26 and 27 are then diffused through the epitaxial layer 25 so as to make contact with the n-type region 22. At this point the n-type epitaxial layer 28 is grown over the p-type epitaxial layer 25 to provide a semiconductive layer of the proper characteristics for forming the transistors of the integrated circuit.

The fabrication method and resistor of the present invention, as hereinbefore described in one of its embodiments, is merely illustrative and not exhaustive in scope. Since many widely different embodiments of the invention may be made without departing from the scope thereof, it is intended that all matter contained in the above description and shown in the accompanying drawing shall be interpreted as illustrative and not in a limiting sense.

What is claimed is:

1. In a multi-component integrated circuit means, a semiconductive resistive component underlying an epitaxial layer which contains transistors of said integrated circuit including a region of a first conductivity type totally embedded in a semiconductive wafer of a second conductivity type, a first layer of semiconductive material of said second conductivity type grown over said wafer so as to cover said region, an epitaxial layer of semiconductive material of said first conductivity type grown so as to cover said region and containing said transistors of said integrated circuit, a conductive path extending up from each end of said region through said first and epitaxial layer, said conductive paths being of said first conductivity type, and an isolation region surrounding each of said conductive paths in said epitaxial layers, said isolation regions being of said second conductivity type, and metallized contacts formed on said conductive paths.

2. In a multi-component integrated circuit means as claimed in claim 1, wherein said region of a first conductivity type is resistive.

3. In a multi-component integrated circuit means as claimed in claim 1, wherein said first conductivity type is n-type and said second conductivity type is p-type.

4. In a multi-component integrated circuit means as claimed in claim 1, wherein said conductive paths are n-type and have an N+ region within said epitaxial layer.

References Cited

UNITED STATES PATENTS

| | | | |
|---|---|---|---|
| 3,223,904 | 12/1965 | Warner | 317—235 |
| 3,239,908 | 3/1966 | Nakamura | 317—235 |
| 3,260,902 | 7/1966 | Porter | 317—235 |
| 3,293,087 | 12/1966 | Porter | 317—235 |
| 3,299,329 | 1/1967 | Pollock | 307—88.5 |
| 3,327,182 | 6/1967 | Kisinko | 317—235 |

JOHN W. HUCKERT, *Primary Examiner.*

J. D. CRAIG, *Assistant Examiner.*